United States Patent
Yamamoto et al.

(10) Patent No.: US 11,456,725 B2
(45) Date of Patent: Sep. 27, 2022

(54) ACOUSTIC WAVE DEVICE, RADIO-FREQUENCY FRONT-END CIRCUIT, AND COMMUNICATION APPARATUS

(71) Applicant: Murata Manufacturing Co., Ltd., Nagaokakyo (JP)

(72) Inventors: Koji Yamamoto, Nagaokakyo (JP); Tsutomu Takai, Nagaokakyo (JP); Hideaki Takahashi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 423 days.

(21) Appl. No.: 16/707,169

(22) Filed: Dec. 9, 2019

(65) Prior Publication Data
US 2020/0186128 A1    Jun. 11, 2020

(30) Foreign Application Priority Data
Dec. 10, 2018    (JP) .............................. JP2018-230786

(51) Int. Cl.
*H03H 9/70*    (2006.01)
*H03H 9/02*    (2006.01)

(52) U.S. Cl.
CPC ........ *H03H 9/706* (2013.01); *H03H 9/02015* (2013.01); *H03H 2218/12* (2013.01)

(58) Field of Classification Search
CPC .......................... H03H 9/706; H03H 9/02015
See application file for complete search history.

(56) References Cited

U.S. PATENT DOCUMENTS

| | | | |
|---|---|---|---|
| 2013/0099630 A1* | 4/2013 | Matsuda | H03H 9/02102 310/346 |
| 2013/0170405 A1* | 7/2013 | Yan | H03H 9/542 333/195 |
| 2013/0285768 A1 | 10/2013 | Watanabe et al. | |
| 2014/0001467 A1 | 1/2014 | Yamazaki et al. | |
| 2018/0159497 A1 | 6/2018 | Iwamoto et al. | |
| 2018/0316333 A1* | 11/2018 | Nakamura | H03H 9/25 |

(Continued)

FOREIGN PATENT DOCUMENTS

| | | |
|---|---|---|
| JP | 2006-229937 A | 8/2006 |
| JP | 4657660 B2 | 3/2011 |
| JP | 6182255 B2 | 8/2017 |

(Continued)

OTHER PUBLICATIONS

Official Communication issued in corresponding Japanese Patent Application No. 2018-230786, dated Apr. 13, 2021.

*Primary Examiner* — Samuel S Outten
(74) *Attorney, Agent, or Firm* — Keating & Bennett, LLP

(57) ABSTRACT

An acoustic wave device includes a high-acoustic-velocity film, a low-acoustic-velocity film provided on the high-acoustic-velocity film, a piezoelectric layer provided on the low-acoustic-velocity film, and an IDT electrode provided on the piezoelectric layer. An acoustic velocity of bulk waves propagating through the high-acoustic-velocity film is higher than an acoustic velocity of acoustic waves propagating through the piezoelectric layer. An acoustic velocity of bulk waves propagating through the low-acoustic-velocity film is lower than an acoustic velocity of bulk waves propagating through the piezoelectric layer. The low-acoustic-velocity film includes a material including hydrogen atoms.

14 Claims, 4 Drawing Sheets

(56) References Cited

U.S. PATENT DOCUMENTS

2019/0036009 A1* 1/2019 Tai ..................... H01L 41/337
2019/0288668 A1   9/2019 Takahashi et al.

FOREIGN PATENT DOCUMENTS

| JP | 2018-195936 A | 12/2018 |
| WO | 2012/086639 A1 | 6/2012 |
| WO | 2017/043427 A1 | 3/2017 |
| WO | 2018/105249 A1 | 6/2018 |

* cited by examiner

ACOUSTIC WAVE DEVICE, RADIO-FREQUENCY FRONT-END CIRCUIT, AND COMMUNICATION APPARATUS

CROSS REFERENCE TO RELATED APPLICATIONS

This application claims the benefit of priority to Japanese Patent Application No. 2018-230786 filed on Dec. 10, 2018. The entire contents of this application are hereby incorporated herein by reference.

BACKGROUND

1. Technical Field

The disclosure relates to an acoustic wave device, a radio-frequency (RF) front-end circuit, and a communication apparatus.

2. Description of the Related Art

Acoustic wave devices have been widely used in filters of cellular phones. International Publication No. 2017/043427 discloses an example of an acoustic wave device. This acoustic wave device includes a multilayer body in which a high-acoustic-velocity supporting substrate, a low-acoustic-velocity film, and a piezoelectric film are laminated in this order, and an interdigital transducer (IDT) electrode provided on the piezoelectric film. A dielectric film is provided on the piezoelectric film to cover the IDT electrode. The acoustic wave device with the above-described multilayer body has a high Q value because the energy of acoustic waves is concentrated on the piezoelectric film side.

International Publication No. 2018/105249 discloses an acoustic wave device in which a silicon oxide film is provided on a LiNbO$_3$ substrate to cover an IDT electrode. International Publication No. 2018/105249 describes that, because the silicon oxide film contains a silanol group and hydrogen atoms, inter-modulation distortion (IMD) may be suppressed.

With the acoustic wave device described in International Publication No. 2017/043427, it is difficult to sufficiently suppress IMD. Therefore, the inventors of the present application have examined use of the silicon oxide film containing hydrogen atoms in International Publication No. 2018/105249 as the dielectric film in the acoustic wave device of International Publication No. 2017/043427. However, when a piezoelectric substrate on the IDT electrode is provided is a multilayer body as described above, it has been discovered that IMD is not sufficiently suppressed even by using the silicon oxide film of International Publication No. 2018/105249.

SUMMARY OF THE INVENTION

Preferred embodiments of the present invention provide acoustic wave devices, RF front-end circuits, and communication apparatuses in which the Q value may be high, and IMD may be significantly reduced or prevented.

According to a preferred embodiment of the present invention, an acoustic wave device includes a high-acoustic-velocity material layer, a low-acoustic-velocity film provided on the high-acoustic-velocity material layer, a piezoelectric layer provided on the low-acoustic-velocity film, and an interdigital transducer (IDT) electrode provided on the piezoelectric layer. An acoustic velocity of bulk waves propagating through the high-acoustic-velocity material layer is higher than an acoustic velocity of acoustic waves propagating through the piezoelectric layer. An acoustic velocity of bulk waves propagating through the low-acoustic-velocity film is lower than an acoustic velocity of bulk waves propagating through the piezoelectric layer. The low-acoustic-velocity film is made of a material including hydrogen atoms.

According to a preferred embodiment of the present invention, a radio-frequency (RF) front-end circuit includes an acoustic wave device according to a preferred embodiment of the present invention, and a power amplifier.

According to a preferred embodiment of the present invention, a communication apparatus includes a radio-frequency (RF) front-end circuit according to a preferred embodiment of the present invention, and an RF signal processing circuit.

According to preferred embodiments of the present invention, acoustic wave devices, RF front-end circuits, and communication apparatuses are provided in which the Q value may be high, and IMD may be significantly reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified by describing specific preferred embodiments of the present invention with reference to the drawings.

Preferred embodiments described in the present specification are exemplary, and it is noted that a partial replacement or combination of configurations in different preferred embodiments is possible.

Figure 1:
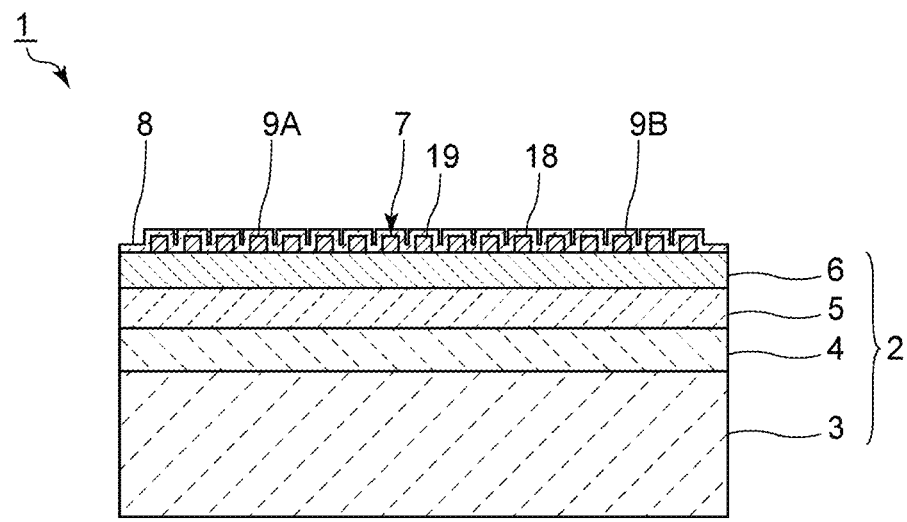
FIG. 1 is an elevational cross-sectional view of an acoustic wave device according to a first preferred embodiment of the present invention.

FIG. 1 is an elevational cross-sectional view of an acoustic wave device according to a first preferred embodiment of the present invention.

An acoustic wave device 1 includes a piezoelectric substrate 2. An IDT electrode 7 is provided on the piezoelectric substrate 2. Acoustic waves are excited in response to application of an alternating-current (AC) voltage to the IDT electrode 7. A pair of reflectors 9A and 9B are provided at two sides in an acoustic wave propagating direction of the IDT electrode 7 on the piezoelectric substrate 2. As described here, the acoustic wave device 1 of the first preferred embodiment is preferably an acoustic wave resonator, for example. An acoustic wave device according to the present invention may be a filter device including an acoustic wave resonator.

The piezoelectric substrate 2 includes a supporting substrate 3, a high-acoustic-velocity film 4 defining and functioning as a high-acoustic-velocity material layer provided on the supporting substrate 3, a low-acoustic-velocity film 5 provided on the high-acoustic-velocity film 4, and a piezoelectric layer 6 provided on the low-acoustic-velocity film 5. The IDT electrode 7 is provided on the piezoelectric layer 6. Note that the configuration of the piezoelectric substrate 2 is not limited to the above.

As the material of the piezoelectric layer 6, for example, piezoelectric single quartz such as lithium niobate or lithium tantalate, or piezoelectric ceramics such as zinc oxide or aluminum nitride may preferably be used.

The low-acoustic-velocity film 5 is a film where the acoustic velocity is relatively low. More specifically, the acoustic velocity of bulk waves propagating through the low-acoustic-velocity film 5 is lower than the acoustic velocity of bulk waves propagating through the piezoelectric layer 6.

The main component of the low-acoustic-velocity film 5 is preferably silicon oxide, for example. More specifically, the low-acoustic-velocity film 5 is preferably made of a material whose main component is silicon oxide and which also includes hydrogen atoms. Silicon oxide is represented by $SiO_x$, and x is an arbitrary positive number. In the first preferred embodiment, the main component of the low-acoustic-velocity film 5 is preferably, for example, $SiO_2$. In the low-acoustic-velocity film 5, hydrogen atoms exist as, for example, a silanol group or a hydroxyl group. The hydrogen atom concentration of the low-acoustic-velocity film 5 is preferably, for example, about $1.46 \times 10^{21}$ atoms/cm$^3$ or greater. In the present specification, the main component refers to a component included in an amount of 50% by weight or more.

The low-acoustic-velocity film 5 is formed by doping dielectrics with water ($H_2O$). More specifically, the low-acoustic-velocity film 5 may be formed by, for example, sputtering. While a film is being formed by sputtering, water is vaporized by a vaporizer and mixed with a sputtering gas, thereby doping dielectrics with hydrogen atoms as a silanol group or the like.

When the low-acoustic-velocity film 5 is formed by doping dielectrics with water, the hydrogen atom concentration of the low-acoustic-velocity film 5 is preferably about $1.46 \times 10^{21}$ atoms/cm$^3$ or greater, for example, as in the first preferred embodiment.

Note that the material of the low-acoustic-velocity film 5 is not limited to the above, and a medium including the above material as the main component, for example, glass, silicon oxynitride, tantalum oxide, or a compound obtained by adding fluorine, carbon, or boron to silicon oxide may also be used.

In the first preferred embodiment, the high-acoustic-velocity material layer is the high-acoustic-velocity film 4. The high-acoustic-velocity material layer is a layer where the acoustic velocity is relatively high. More specifically, the acoustic velocity of bulk waves propagating through the high-acoustic-velocity material layer is higher than the acoustic velocity of acoustic waves propagating through the piezoelectric layer 6. As the material of the high-acoustic-velocity film 4, for example, a medium including the above material as the main component, such as aluminum oxide, silicon carbide, silicon nitride, silicon oxynitride, silicon, sapphire, lithium tantalate, lithium niobate, quartz, alumina, zirconia, cordierite, mullite, steatite, forsterite, magnesia, diamond-like carbon (DLC) film, or diamond may be used.

As the material of the supporting substrate 3, for example, piezoelectric materials such as aluminum oxide, lithium tantalate, lithium niobate, and quartz, various ceramics such as alumina, magnesia, silicon nitride, aluminum nitride, silicon carbide, zirconia, cordierite, mullite, steatite, and forsterite, dielectrics such as sapphire, diamond, and glass, semiconductor such as silicon and gallium nitride, or resin may be used.

A dielectric film 8 is provided on the piezoelectric substrate 2 to cover the IDT electrode 7. The main component of the dielectric film 8 is $SiO_2$. In the first preferred embodiment, the dielectric film 8 includes almost no hydrogen atoms. Therefore, the hydrogen atom concentration of the low-acoustic-velocity film 5 is higher than the hydrogen atom concentration of the dielectric film 8. Note that the main component of the dielectric film 8 may be dielectrics other than silicon oxide.

The dielectric film 8 need not always be provided. As in the first preferred embodiment, the dielectric film 8 is preferably provided to cover the IDT electrode 7, for example. Accordingly, the IDT electrode 7 is not easily damaged.

Figure 2:
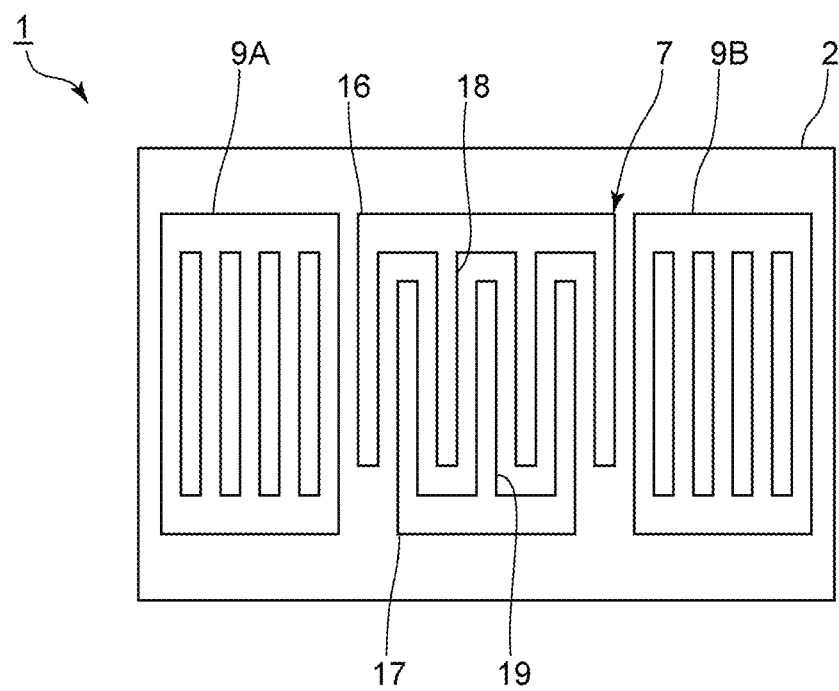
FIG. 2 is an enlarged plan view showing a portion near electrode fingers of an IDT electrode in the first preferred embodiment of the present invention.

FIG. 2 is an enlarged plan view showing a portion near electrode fingers of the IDT electrode in the first preferred embodiment.

The IDT electrode 7 includes a first busbar 16 and a second busbar 17 facing each other. The IDT electrode 7 includes a plurality of first electrode fingers 18 whose first ends are connected to the first busbar 16. The IDT electrode 7 further includes a plurality of second electrode fingers 19 whose first ends are connected to the second busbar 17. The plurality of first electrode fingers 18 and the plurality of second electrode fingers 19 interdigitate with each other.

The IDT electrode 7, the reflector 9A, and the reflector 9B may include a multi-metal layer made by laminating a plurality of metal layers, or may include a single metal layer.

Referring back to FIG. 1, the acoustic wave device 1 of the first preferred embodiment includes the high-acoustic-velocity film 4 defining and functioning as the high-acoustic-velocity material layer, the low-acoustic-velocity film 5 provided on the high-acoustic-velocity film 4, the piezoelectric layer 6 provided on the low-acoustic-velocity film 5, and the IDT electrode 7 provided on the piezoelectric layer 6. The acoustic wave device 1 has a configuration in which the acoustic velocity of bulk waves propagating through the high-acoustic-velocity film 4 is higher than the acoustic velocity of acoustic waves propagating through the piezoelectric layer 6, the acoustic velocity of bulk waves propagating through the low-acoustic-velocity film 5 is lower than the acoustic velocity of bulk waves propagating through the piezoelectric layer 6, and the low-acoustic-velocity film 5 is made of a material including hydrogen atoms. Accordingly, the Q value may be high, and IMD may be significantly reduced or prevented. This will be described hereinafter.

In the first preferred embodiment, the piezoelectric substrate 2 of the acoustic wave device 1 has a configuration in which the high-acoustic-velocity film 4, the low-acoustic-velocity film 5, and the piezoelectric layer 6 are laminated in this order. Accordingly, the energy of acoustic waves is able to be effectively confined on the piezoelectric layer 6 side, thus effectively increasing the Q value. In addition, because the low-acoustic-velocity film 5 is made of a material including hydrogen atoms, IMD may be significantly reduced or prevented.

The advantageous effect that IMD may be significantly reduced or prevented will be described in detail hereinafter by comparing the first preferred embodiment, a first comparative example, and a second comparative example.

An acoustic wave device having the configuration of the first preferred embodiment, and acoustic wave devices of the first comparative example and the second comparative example were made. In the first preferred embodiment, a low-acoustic-velocity film was formed by doping dielectrics with water, and a dielectric film was made without doping dielectrics with water. In contrast, in the first comparative example, a dielectric film and a low-acoustic-velocity film were formed without doping dielectrics with water. In the second comparative example, a low-acoustic-velocity film was formed without doping dielectrics with water, and a dielectric film was formed by doping dielectrics with water.

Next, the IMD level of each of the above-described acoustic wave devices was measured. The results are indicated below in FIGS. 3 and 4. Note that the acoustic wave device of the first comparative example was made for comparison with the first preferred embodiment and for comparison with the second comparative example, and the IMD level of each acoustic wave device was measured.

Figure 3:
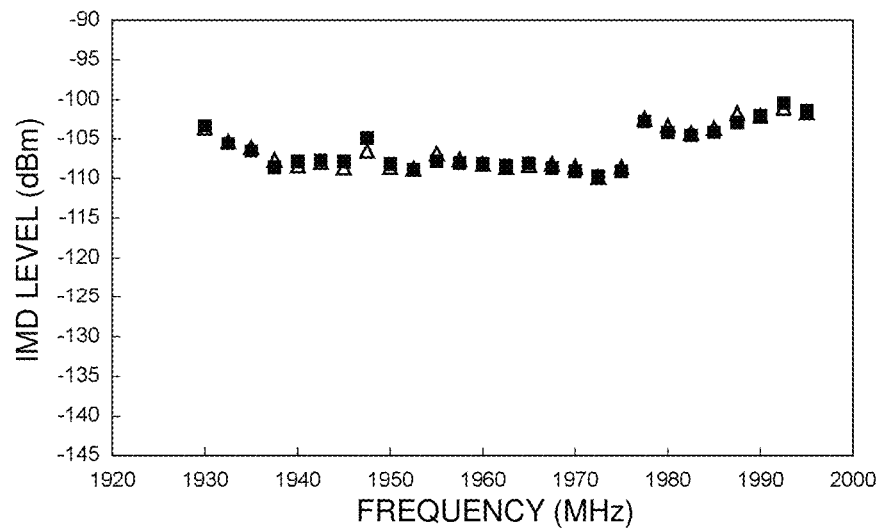
FIG. 3 is a diagram showing the IMD level in a first comparative example and a second comparative example.
Figure 4:
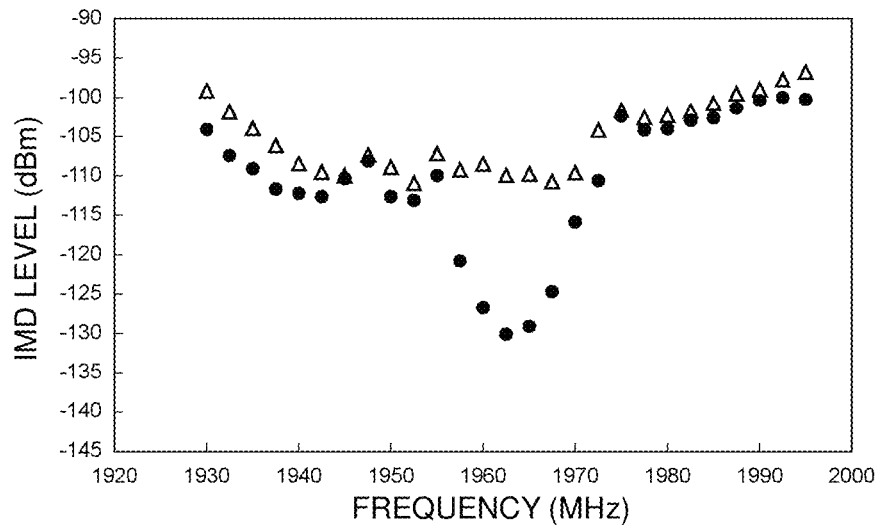
FIG. 4 is a diagram showing the IMD level in the first preferred embodiment of the present invention and in the first comparative example.

FIG. 3 is a diagram showing the IMD level in the first comparative example and the second comparative example. FIG. 4 is a diagram showing the IMD level in the first preferred embodiment and the first comparative example. In FIG. 3, triangular plots indicate the results of the first comparative example, and rectangular plots indicate the results of the second comparative example. In FIG. 4, triangular plots indicate the results of the first comparative example, and circular plots indicate the results of the first preferred embodiment.

As shown in FIG. 3, it is clear that the IMD level remains almost unchanged in the first comparative example and the second comparative example. It is clear that IMD is not improved even by increasing the hydrogen atom concentration of the dielectric film, as in the second comparative example.

In contrast, as shown in FIG. 4, it is clear that the IMD level is lower in the first preferred embodiment than that in the first comparative example. More specifically, IMD is significantly reduced or prevented in a frequency area near about 1955 MHz to about 1970 MHz in the first preferred embodiment. Accordingly, IMD may be significantly reduced or prevented in the first preferred embodiment.

IMD may be significantly reduced or prevented in the first preferred embodiment because of the following conceivable reasons. Because the low-acoustic-velocity film 5 shown in FIG. 1 is made of a material including hydrogen atoms, vibrations of the low-acoustic-velocity film 5 are significantly reduced or prevented. Accordingly, significant reduction or prevention of unnecessary vibrations of the piezoelectric layer 6 is able to be provided, thus significantly reducing or preventing IMD.

The hydrogen atom concentration of the low-acoustic-velocity film 5 is preferably, for example, greater than or equal to about $1.46 \times 10^{21}$ atoms/cm$^3$, as in the first preferred embodiment. In this case, IMD may be further significantly reduced or prevented.

The main component of the low-acoustic-velocity film 5 and the dielectric film 8 is preferably silicon oxide, for example. Accordingly, the absolute value of the temperature coefficient of frequency (TCF) may be reduced. Accordingly, variations of the frequency in response to temperature changes may be significantly reduced or prevented.

For example, a bonding layer including titanium oxide may be provided in the low-acoustic-velocity film 5. The bonding layer is provided in forming the piezoelectric substrate 2. Note that the bonding layer need not be provided.

As described above, the piezoelectric substrate 2 is a multilayer body including the supporting substrate 3, the high-acoustic-velocity film 4, the low-acoustic-velocity film 5, and the piezoelectric layer 6. The piezoelectric layer 6 is indirectly provided, with the low-acoustic-velocity film 5 provided therebetween, on the high-acoustic-velocity film 4 functioning as and defining the high-acoustic-velocity material layer. The configuration of the piezoelectric substrate 2 is not limited to the above. Hereinafter, a first modification and a second modification of the first preferred embodiment, which are different from the first preferred embodiment only in the configuration of the piezoelectric substrate, will be described. In the first modification and the second modification, as in the first preferred embodiment, the Q value may be high, and IMD may be significantly reduced or prevented.

Figure 5:
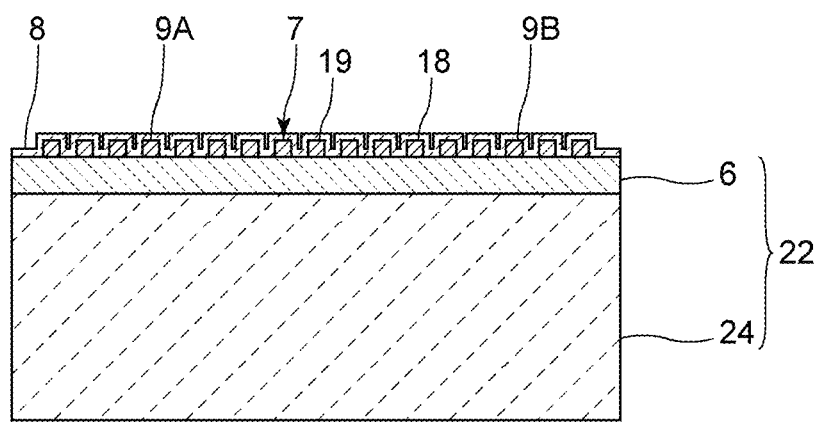
FIG. 5 is an elevational cross-sectional view of an acoustic wave device according to a first modification of the first preferred embodiment of the present invention.

In the first modification shown in FIG. 5, the high-acoustic-velocity material layer is a high-acoustic-velocity supporting substrate 24. A piezoelectric substrate 22 includes the high-acoustic-velocity supporting substrate 24, and the piezoelectric layer 6 provided on the high-acoustic-velocity supporting substrate 24. As described here, the piezoelectric layer 6 may be provided directly on the high-acoustic-velocity supporting substrate 24 defining and functioning as the high-acoustic-velocity material layer.

As the material of the high-acoustic-velocity supporting substrate 24, for example, a medium including the above material as the main component, such as aluminum oxide, silicon carbide, silicon nitride, silicon oxynitride, silicon, sapphire, lithium tantalate, lithium niobate, quartz, alumina, zirconia, cordierite, mullite, steatite, forsterite, magnesia, DLC film, or diamond may be used.

Figure 6:
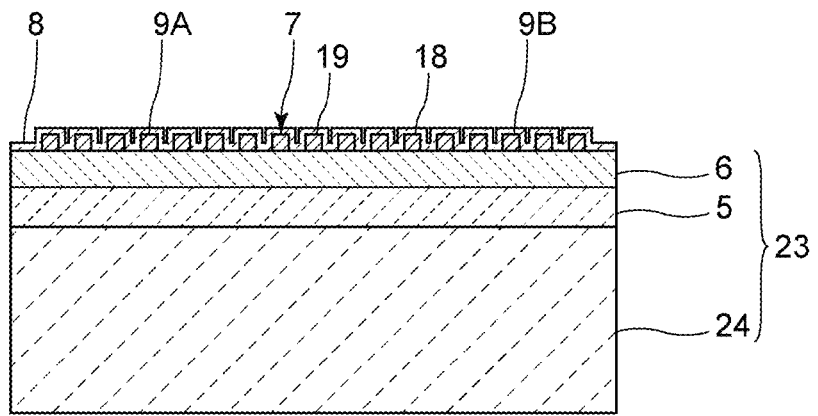
FIG. 6 is an elevational cross-sectional view of an acoustic wave device according to a second modification of the first preferred embodiment of the present invention.

In the second modification shown in FIG. 6, a piezoelectric substrate 23 includes the high-acoustic-velocity supporting substrate 24, the low-acoustic-velocity film 5 provided on the high-acoustic-velocity supporting substrate 24, and the piezoelectric layer 6 provided on the low-acoustic-velocity film 5.

Figure 7:
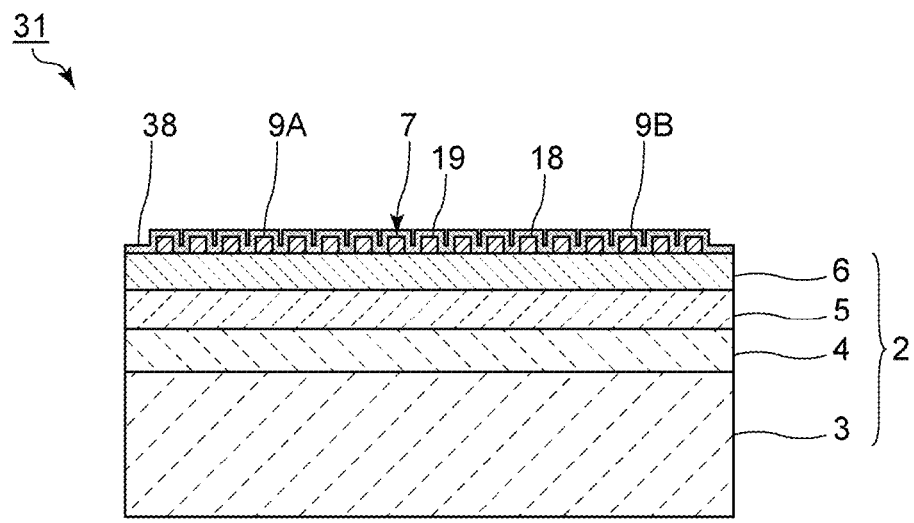
FIG. 7 is an elevational cross-sectional view of an acoustic wave device according to a second preferred embodiment of the present invention.

FIG. 7 is an elevational cross-sectional view of an acoustic wave device according to a second preferred embodiment of the present invention.

The second preferred embodiment is different from the first preferred embodiment in that a dielectric film 38 is made of a material including hydrogen atoms. The main component of the dielectric film 38 is preferably, for example, SiO$_2$. In the dielectric film 38, hydrogen atoms exist as, for example, a silanol group or a hydroxyl group. An acoustic wave device 31 of the second preferred embodiment has the same or substantially the same configuration as that of the acoustic wave device 1 of the first preferred embodiment except for the above-described point. Note that, also in the second preferred embodiment, the hydrogen atom concentration of the low-acoustic-velocity film 5 is higher than the hydrogen atom concentration of the dielectric film 38.

Similar to the first preferred embodiment, the piezoelectric substrate 2 of the acoustic wave device 31 has a configuration in which the high-acoustic-velocity film 4, the low-acoustic-velocity film 5, and the piezoelectric layer 6 are laminated in this order. Accordingly, the Q value may be increased. In addition, because the hydrogen atom concentration of the low-acoustic-velocity film 5 is higher than the hydrogen atom concentration of the dielectric film 38, the hydrogen atom concentration of the low-acoustic-velocity film 5 is sufficiently high. Accordingly, IMD may be significantly reduced or prevented.

It is preferable that the hydrogen atom concentration of the dielectric film 38 be greater than or equal to about $1.46 \times 10^{21}$ atoms/cm$^3$ or greater, for example. Accordingly, IMD may be further significantly reduced or prevented.

In the second preferred embodiment, the high-acoustic-velocity material layer is the high-acoustic-velocity film 4. Similar to the second modification of the first preferred embodiment, the high-acoustic-velocity material layer may be the high-acoustic-velocity supporting substrate 24.

The acoustic wave device of each of the above-described preferred embodiments may be used as a duplexer of an RF front-end circuit. This example will be described hereinafter.

Figure 8:
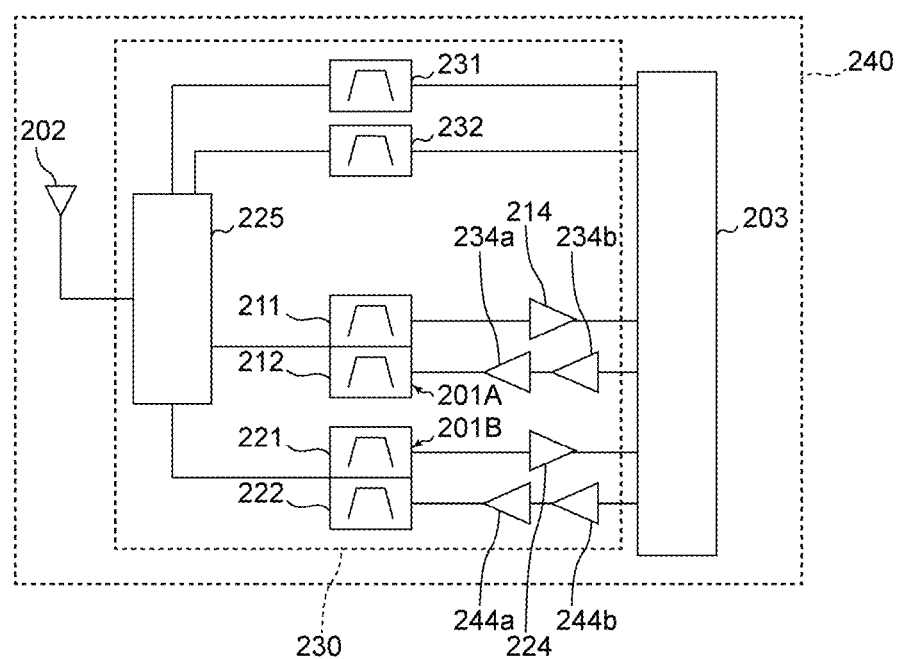
FIG. 8 is a diagram showing a communication apparatus including an RF front-end circuit.

FIG. 8 is a diagram showing the configuration of a communication apparatus and an RF front-end circuit. Note that elements electrically connected to an RF front-end circuit 230, for example, an antenna element 202 and an RF signal processing circuit (radio frequency integrated circuit (RFIC)) 203, are additionally shown in FIG. 8. The RF front-end circuit 230 and the RF signal processing circuit 203 define a communication apparatus 240. Note that the communication apparatus 240 may include a power source, a central processing unit (CPU), and a display, for example.

The RF front-end circuit 230 includes a switch 225, duplexers 201A and 201B, filters 231 and 232, low-noise amplifier circuits 214 and 224, and power-amplifier circuits 234a, 234b, 244a, and 244b. Note that the RF front-end circuit 230 and the communication apparatus 240 in FIG. 8 are only an example of an RF front-end circuit and a communication apparatus, and are not restricted to this configuration.

The duplexer 201A includes filters 211 and 212. The duplexer 201B includes filters 221 and 222. The duplexers 201A and 201B are electrically connected to the antenna element 202 with the switch 225 provided therebetween. Note that an acoustic wave device according to a preferred embodiment of the present invention may be the duplexers 201A and 201B, and/or may be the filters 211, 212, 221, and 222.

Furthermore, the above-described acoustic wave devices according to preferred embodiments of the present invention are applicable to a multiplexer with three or more filters, for example, a triplexer with three filters having a common antenna terminal, or a hexaplexer with six filters having a common antenna terminal.

That is, the above-described acoustic wave devices according to a preferred embodiment of the present invention include an acoustic wave resonator, a filter, a duplexer, and a multiplexer with three or more filters. The multiplexer is not restricted to a configuration provided with both a transmission filter and a reception filter, and may have a configuration that only has a transmission filter or a reception filter.

The switch 225 preferably includes, for example, a Single Pole Double Throw (SPDT) switch, which electrically connects the antenna element 202 and a signal path corresponding to a certain band in accordance with a control signal from a controller (not shown). Note that the number of signal paths connected to the antenna element 202 is not limited to one, but may be plural. In other words, the RF front-end circuit 230 may correspond to carrier aggregation.

The low-noise amplifier 214 is a reception amplifier circuit that amplifies an RF signal (here, an RF reception signal) having gone through the antenna element 202, the switch 225, and the duplexer 201A, and outputs the amplified signal to the RF signal processing circuit 203. The low-noise amplifier 224 is a reception amplifier circuit that amplifies an RF signal (here, an RF reception signal) having gone through the antenna element 202, the switch 225, and the duplexer 201B, and outputs the amplified signal to the RF signal processing circuit 203.

The power-amplifier circuits 234a and 234b are transmission amplifier circuits that amplify an RF signal (here, an RF transmission signal) output from the RF signal processing circuit 203, and output the amplified signal to the antenna element 202 via the duplexer 201A and the switch 225. The power-amplifier circuits 244a and 244b are transmission amplifier circuits that amplify an RF signal (here, an RF transmission signal) output from the RF signal processing circuit 203, and output the amplified signal to the antenna element 202 via the duplexer 201B and the switch 225.

The RF signal processing circuit 203 performs signal processing on an RF reception signal input from the antenna element 202 via a reception signal path by, for example, down-converting the RF reception signal, and outputs a reception signal generated by the signal processing. In addition, the RF signal processing circuit 203 performs signal processing on an input transmission signal by, for example, up-converting the transmission signal, and outputs an RF transmission signal generated by the signal processing to the power-amplifier circuits 234a, 234b, 244a, and 244b. The RF signal processing circuit 203 is, for example, an RFIC. Note that the communication apparatus may include a baseband integrated circuit (BBIC). In this case, the BBIC performs signal processing on a reception signal processed by the RFIC. In addition, the BBIC performs signal processing on a transmission signal, and outputs the processed transmission signal to the RFIC. A reception signal processed by the BBIC and a transmission signal before being subjected to signal processing by the BBIC are, for example, image signals or audio signals.

Note that the RF front-end circuit 230 may include duplexers according to modifications of the duplexers 201A and 201B, instead of the above-described duplexers 201A and 201B.

In contrast, the filters 231 and 232 of the communication apparatus 240 are electrically connected between the RF signal processing circuit 203 and the switch 225 without having the low-noise amplifier circuits 214 and 224 and the power amplifier circuits 234a, 234b, 244a, and 244b provided therebetween. Like the duplexers 201A and 201B, the filters 231 and 232 are electrically connected to the antenna element 202 with the switch 225 provided therebetween.

According to the RF front-end circuit 230 and the communication apparatus 240 with the above configuration, the Q value may be increased, and IMD may be significantly reduced or prevented by providing an acoustic wave resonator, a filter, a duplexer, or a multiplexer with three or more filters, which is an acoustic wave device of preferred embodiments of the present invention.

Although acoustic wave devices, RF front-end circuits, and communication apparatuses according to preferred embodiments of the present invention have been described by citing the preferred embodiments and their modifications, the present invention includes other preferred embodiments achieved by combining arbitrary elements in the above-described preferred embodiments and modifications, a modification achieved by applying various modifications conceivable to those skilled in the art to the above-described preferred embodiments without departing from the gist of the present invention, and various devices including the RF front-end circuit and the communication apparatus according to the present invention.

Preferred embodiments of the present invention may be widely used in communication devices, for example, cellular phones as an acoustic wave resonator, a filter, a duplexer, a multiplexer applicable to a multiband system, a front-end circuit, and a communication apparatus.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a high-acoustic-velocity material layer;
   a low-acoustic-velocity film provided on or above the high-acoustic-velocity material layer;
   a piezoelectric layer provided on or above the low-acoustic-velocity film; and
   an interdigital transducer (IDT) electrode provided on or above the piezoelectric layer; wherein
   an acoustic velocity of bulk waves propagating through the high-acoustic-velocity material layer is higher than an acoustic velocity of acoustic waves propagating through the piezoelectric layer;
   an acoustic velocity of bulk waves propagating through the low-acoustic-velocity film is lower than an acoustic velocity of bulk waves propagating through the piezoelectric layer;
   the low-acoustic-velocity film is made of a material including hydrogen atoms; and
   a hydrogen atom concentration of the low-acoustic-velocity film is greater than or equal to about $1.46 \times 10^{21}$ atoms/cm$^3$.

2. The acoustic wave device according to claim 1, further comprising a dielectric film provided on the piezoelectric layer to cover the IDT electrode.

3. The acoustic wave device according to claim 2, wherein the hydrogen atom concentration of the low-acoustic-velocity film is higher than a hydrogen atom concentration of the dielectric film.

4. The acoustic wave device according to claim 2, wherein the dielectric film is made of a material including silicon oxide as a main component.

5. The acoustic wave device according to claim 2, wherein the high-acoustic-velocity film, the low-acoustic-velocity film, and the piezoelectric layer are laminated in this order.

6. A radio-frequency (RF) front-end circuit comprising:
   the acoustic wave device according to claim 1; and
   a power amplifier.

7. A communication apparatus comprising:
   the radio-frequency (RF) front-end circuit according to claim 6; and
   an RF signal processing circuit.

8. The acoustic wave device according to claim 1, further comprising:
   a supporting substrate; wherein
   the high-acoustic-velocity material layer is a high-acoustic-velocity film provided between the supporting substrate and the low-acoustic-velocity film.

9. The acoustic wave device according to claim 1, wherein the high-acoustic-velocity material layer is a high-acoustic-velocity supporting substrate.

10. The acoustic wave device according to claim 1, wherein the low-acoustic-velocity film is made of a material including silicon oxide as a main component.

11. The acoustic wave device according to claim 1, wherein
    the IDT electrode includes a first busbar connected to a plurality of first electrode fingers and a second busbar connected to a plurality of second electrode fingers; and
    the plurality of first electrode fingers is interdigitated with the plurality of second electrode fingers.

12. The acoustic wave device according to claim 1, wherein a bonding layer including titanium oxide is provided in the low-acoustic-velocity film.

13. The acoustic wave device according to claim 1, wherein a pair of reflectors is provided at two sides in an acoustic wave propagating direction of the IDT electrode on the piezoelectric substrate.

14. The acoustic wave device according to claim 1, wherein the IDT electrode is a multi-metal layer defined by a plurality of laminated metal layers.

* * * * *